United States Patent [19]
Gnade et al.

[11] Patent Number: 5,470,802
[45] Date of Patent: Nov. 28, 1995

[54] METHOD OF MAKING A SEMICONDUCTOR DEVICE USING A LOW DIELECTRIC CONSTANT MATERIAL

[75] Inventors: Bruce E. Gnade, Dallas; Chih-Chen Cho, Richardson, both of Tex.; Douglas M. Smith, Albuquerque, N.M.

[73] Assignee: Texas Instruments Incorporated, Dallas, Tex.

[21] Appl. No.: 247,195

[22] Filed: May 20, 1994

[51] Int. Cl.⁶ .................................................. H01L 21/02
[52] U.S. Cl. ........................... 437/238; 437/60; 437/195; 252/313.1
[58] Field of Search ............................ 437/238, 60, 195; 252/313.2, 313.1, 315.2, 315.6; 423/338

[56] References Cited

U.S. PATENT DOCUMENTS

| | | | |
|---|---|---|---|
| 4,652,467 | 3/1987 | Brinker et al. | 427/246 |
| 4,987,101 | 1/1991 | Kaanta et al. | 437/228 |
| 5,023,208 | 6/1991 | Pope et al. | 501/12 |
| 5,103,288 | 4/1992 | Sakamoto et al. | 357/71 |
| 5,185,037 | 2/1993 | Kaijou | 252/313.2 |
| 5,275,889 | 1/1994 | Yokouchi et al. | 428/426 |
| 5,390,073 | 2/1995 | McMillan | 361/327 |
| 5,393,712 | 2/1995 | Rostoker et al. | 437/238 |

OTHER PUBLICATIONS

08/055,069, Deshtande et al., Apr. 28, 1993.
08/234,443, Cho, class 257, Apr. 28. 1994.

*Primary Examiner*—Brian E. Hearn
*Assistant Examiner*—Lynne A. Gurley
*Attorney, Agent, or Firm*—Richard A. Stoltz; Richard L. Donaldson; William E. Hiller

[57] ABSTRACT

This invention provides a process for making a semiconductor device with reduced capacitance between adjacent conductors. This process can include applying a solution between conductors 24, and then gelling, surface modifying, and drying the solution to form an extremely porous dielectric layer 28. A non-porous dielectric layer 30 may be formed over porous layer 28, which may complete an interlayer dielectric. A novel process for creating the porous dielectric layer is disclosed, which can be completed at vacuum or ambient pressures, yet results in porosity, pore size, and shrinkage of the dielectric during drying comparable to that previously attainable only by drying gels at supercritical pressure.

20 Claims, 6 Drawing Sheets

METHOD OF MAKING A SEMICONDUCTOR DEVICE USING A LOW DIELECTRIC CONSTANT MATERIAL

FIELD OF THE INVENTION

This invention relates generally to the fabrication of dielectrics on semiconductor devices, and more particularly to methods for reducing capacitive coupling on a semiconductor device using electrical insulators made of porous dielectric materials.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air (including partial vacuum) has a dielectric constant of just over 1.0. Consequently, many capacitance-reducing schemes have been devised to at least partially replace solid dielectrics with air.

U.S. Pat. No. 4,987,101, issued to Kaanta et al., on Jan. 22, 1991, describes a method for fabricating gas (air) dielectrics, which comprises depositing a temporary layer of removable material between supports (such as conductors), covering this with a capping insulator layer, opening access holes in the cap, extracting the removable material through these access holes, then closing the access holes. This method can be cumbersome, partially because it requires consideration of access hole locations in the design rules and alignment error budget during circuit design, as well as requiring extra processing steps to create and then plug the holes. This method may also create large void areas which have essentially no means of handling mechanical stress and heat dissipation.

U.S. Pat. No. 5,103,288, issued to Sakamoto, on Apr. 7, 1992, describes a multilayered wiring structure which decreases capacitance by employing a porous dielectric with 50% to 80% porosity (porosity is the percentage of a structure which is hollow) and pore sizes of roughly 5 nm to 50 nm. This structure is typically formed by depositing a mixture of an acidic oxide and a basic oxide, heat treating to precipitate the basic oxide, and then dissolving out the basic oxide. Dissolving all of the basic oxide out of such a structure may be problematic, because small pockets of the basic oxide may not be reached by the leaching agent. Furthermore, several of the elements described for use in the basic oxides (including sodium and lithium) are generally considered contaminants in the semiconductor industry, and as such are usually avoided in a production environment. Creating only extremely small pores (less than 10 nm) may be difficult using this method, yet this requirement will exist as submicron processes continue to scale towards a tenth of a micron and less.

Another method of forming porous dielectric films on semiconductor substrates (the term "substrate" is used loosely herein to include any layers formed prior to the conductor/insulator level of interest) is described in U.S. Pat. No. 4,652,467, issued to Brinker et al., on Mar. 24, 1987. This patent teaches a sol-gel technique for depositing porous films with controlled porosity and pore size (diameter), wherein a solution is deposited on a substrate, gelled, and then cross-linked and densified by removing the solvent through evaporation, thereby leaving a porous dielectric. This method has as a primary objective the densification of the film, which teaches away from low dielectric constant applications. Dielectrics formed by this method are typically 15% to 50% porous, with a permanent film thickness reduction of at least 20% during drying. The higher porosities (e.g. 40%–50%) can only be achieved at pore sizes which are generally too large for such microcircuit applications. These materials are usually referred to as xerogels, although the final structure is not a gel, but an open-pored (the pores are generally interconnected, rather than being isolated cells) porous structure of a solid material.

SUMMARY OF THE INVENTION

The present invention provides a method for forming highly porous, finely pored (pore diameter of less than 80 nm and preferably of 2 nm to 25 nm), low dielectric constant (k less than 3.0 and preferably less than 2.0) dielectric films for use as semiconductor insulators. Surprisingly, the methods of this invention can provide an extremely low dielectric constant insulation structure, formed from a wet gel with controlled shrinkage, without employing exotic production techniques or incurring disadvantages found in other low dielectric constant methods.

A previously unrecognized problem in the application of dried gel dielectrics to microcircuits recognized herein is the shrinkage typically observed during gel drying, which may cause mechanical imperfections such as large voids, cracks, powdering, loose dielectric fragments, and stresses in surrounding structure, as well as densification (and increased dielectric constant) of the dielectric layer itself. Mechanical imperfections are particularly undesirable (and likely) when the porous material is required to fill a high-aspect ratio (height greater than width) gap between adjacent conductors, such as those commonly found on submicron integrated circuits, as shrinkage in such gaps may pull the dielectric loose from the bottom and/or sides of the trench. The primary underlying cause of xerogel shrinkage during drying has now been recognized as resulting from capillary pressure created at the boundary between liquid and vapor solvent in the pores during drying. The methods of this invention provide a novel solution for controlling densification and other shrinkage effects, which can be easily applied to semiconductor fabrication, resulting in a substantially undensified, highly porous rigid structure which can be formed even in high aspect ratio geometries.

Some of the other advantages possible with the present invention are: the processing can be done at atmospheric pressure, which not only simplifies processing but allows the construction of multiple porous layers on the same device;

the solvents can be removed essentially completely from the porous film; the materials used in the process are not harmful to semiconductor devices; the porous structure can be made hydrophobic (water repelling); high temperatures are not required at any stage in the application; the dried porous structure has adequate structural strength to allow deposition of other layers on top of it; and, importantly, the pores formed in the dielectric can be made small enough to allow this method to be used with device feature sizes in the 0.5 to 0.1 micron range, or even smaller.

The present invention can provide a method for forming a porous dielectric film on a semiconductor device for the primary purpose of decreasing unwanted capacitive coupling between conductors on the semiconductor device. The method can include providing a layer containing at least two patterned conductors formed on a substrate and depositing a thin film on the substrate from a non-gelled solution which may then be gelled on the substrate to form a wet, open-pored porous gel (in the wetted state, the pores of the gel are filled with liquid). Gelation is preferably accomplished by hydrolysis and condensation of metal alkoxides, gelling of particulate or colloidal metal oxides, gelation of organic precursors, or a combination of these approaches. The method can further comprise aging the wet gel for a predetermined period of time under controlled temperature conditions. The method can further comprise performing a solvent exchange on the wet gel to remove substantially all water from the gel structure. The method can further comprise reacting the wet gel with a surface modification agent. This reaction preferably causes the replacement of at least 15% (and more preferably, at least 30%) of highly reactive groups (e.g. hydroxyl or alkoxyl groups) present on the internal pore surfaces with more stable surface groups or ions (e.g. organic, fluorine, fluorocarbon), thereby at least partially preventing condensation reactions between neighboring groups on the internal pore surfaces during drying, and thereby controlling densification. The surface modification may also substantially increase the pore fluid contact angle within the pores of the wet gel, thereby reducing capillary pressure during non-supercritical drying. The surface modification may also render the porous structure hydrophobic. The method can further comprise preferably drying the gelled film at one or more sub-critical pressures (from vacuum to near-critical) and more preferably, at atmospheric pressure, or alternately (but not preferably) drying the gelled film under supercritical conditions.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Figure 1:
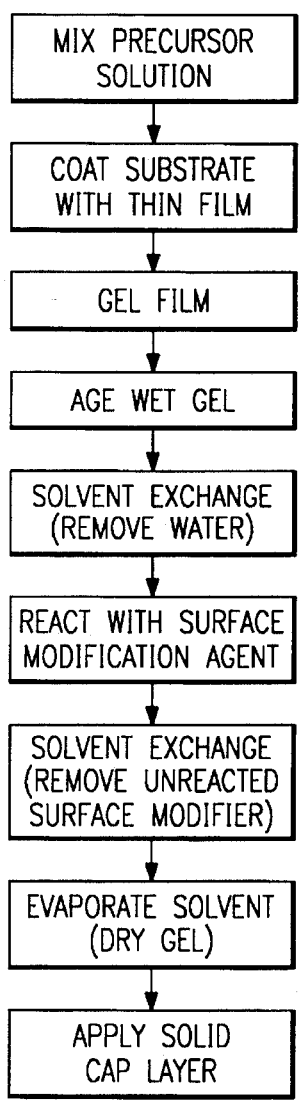
FIG. 1 shows a block diagram of the steps in a typical embodiment of the invention.

Typical embodiments of the invention may be comprised of the steps shown in FIG. 1, although not all steps shown may be required in a given embodiment. Furthermore, materials may be substituted in several of the steps to achieve various effects, and processing parameters such as times, temperatures, pressures, and relative concentrations of ingredients may be varied over broad ranges. In FIG. 1, various precursor solutions (some of which are described in detail in the specific examples) may be mixed, and then applied to a substrate upon which a layer of patterned conductors has been formed. The method of application may be, for example, a spin-on technique in a controlled atmosphere which limits solvent evaporation. The object of the application in at least one embodiment is to form a layer of the precursor which will at least substantially fill the gaps between adjacent conductors. The precursor solution is allowed to gel on the substrate, a process which typically takes from 1 minute to 12 hours, depending on the solution and method of gelling. The wet gel can be allowed time to age, generally about a day (although it may be much shorter), at one or more controlled temperatures. If the wet gel contains water, one or more washing steps can be used to perform a solvent exchange on the gel, thereby removing the water but leaving the gel in a wet state. The solvent may be either a protic (e.g. ethanol) or an aprotic (e.g. acetone or hexane) solvent. The wet gel may then be reacted with a surface modification agent (the effects of the surface modification step will be explained below) by a method such as immersing the structure in a mixture containing the surface modification agent and a solvent in which the modification agent is soluble. This solvent must also be miscible with the solvent already present in the wet gel. Another solvent exchange may be subsequently used to remove excess surface modification agent from the structure. The solvent is allowed to evaporate out of the gel, leaving a porous dielectric structure. If the film is substantially undensified during drying, the dried gel exhibits essentially the same structure as the wet gel (the dried film thickness is substantially the same as the wet gel film thickness). The porous dielectric may finally be capped with a non-porous insulation layer, as detailed in the specific examples.

Figure 2A:
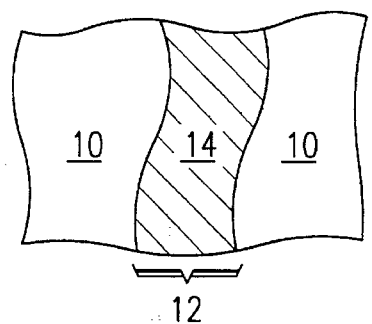
FIGS. 2A–2D show cross-sectional illustrations of a solvent-filled pore, before and during solvent evaporation.
Figure 2B:
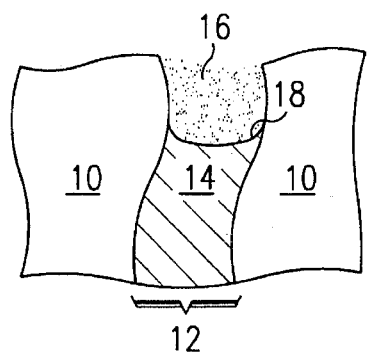

Referring to FIG. 2A, a cross-section of a single pore 12 in a wet gel structure 10 is shown, with a liquid pore fluid 14 filling pore 12. FIG. 2B shows the same pore undergoing evaporation of the pore fluid. A phase change (from liquid to vapor) is illustrated by the formation of a meniscus 18, which is shown as a crescent-shaped boundary between liquid pore fluid 14 and vapor 16 formed during evaporation. The meniscus is an indication of the surface tension of the pore fluid exerting an inward (usually, although some fluids can exert outward) pressure on the walls of the pore. This capillary pressure P can be related to the pore fluid surface tension $T_s$, the contact angle q (the angle at which the fluid meniscus contacts the surface of the pore), and the pore radius r, by the equation $$P = \frac{2T_s \cos q}{r} \quad (1)$$

The difficulty in maintaining the integrity of extremely small pores (small r) during drying is evident from this equation, since every halving of radius r doubles the pressure on the pore walls. Unfortunately, a porous dielectric suitable for use between conductors should contain pores at least an order of magnitude smaller than the interconductor gap (r approximately 10 nanometers for a 0.2 micron gap, for example). Adjusting pore size upwards to relieve capillary pressure is therefore a limited option for microelectronic applications. On the other hand, simply allowing pores to collapse from the capillary pressure results in excessive shrinkage, with the corresponding densification of the dielectric defeating the primary purpose of the method (reducing dielectric constant) as well as preventing good surface adhesion.

To circumvent the capillary pressure problem in monolithic xerogel synthesis, the aerogel technique has been developed. Generally, this variation of the xerogel technique removes a solvent from a wet gel under supercritical pressure and temperature conditions. By removing the solvent in the supercritical region, vaporization of the liquid solvent does not take place; instead, the fluid undergoes a constant change in density during the operation, changing from a compressed liquid to a superheated vapor with no distinguishable state boundary. This technique avoids the capillary pressure problem entirely, since no state change boundaries ever exist in the pores. Adapting the aerogel technique to semiconductor fabrication appears to be problematic and expensive; typical solvent candidates have high critical pressures (e.g. ethanol, 924 psi, carbon dioxide, 1071 psi) which make application difficult in most circumstances. For instance, these pressures may tend to crush previous layers or porous dielectric capped under atmospheric pressure or force the wet gel into the pores of previous porous dielectric layers left uncapped, and may require containment of the wet gel at the edges of the water to prevent the gel from being squeezed off the wafer before the gel can be dried. Nevertheless, a highly porous, finely pored dielectric structure may be formed by this process under some conditions, making this supercritical technique possibly useful in the practice of the present invention.

Figure 2C:
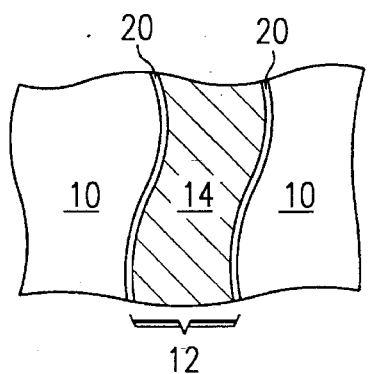
Figure 2D:
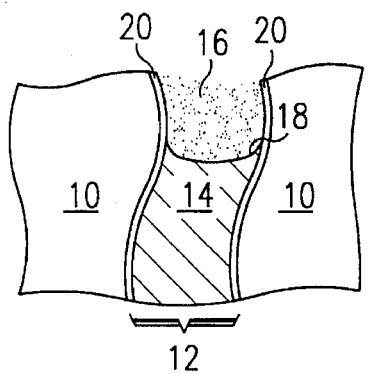

As an alternative to this, the present invention includes a group of novel techniques which may be applied at a range of pressures from vacuum to near-critical, with atmospheric pressure being preferable due to ease of handling and compatibility with previous porous layers. One similarity in these techniques is that a surface modification step is performed on the wet gel, replacing a substantial number of the molecules on the pore walls with those of another species. This surface modification typically replaces reactive surface groups such as hydroxyls and alkoxyls with more stable surface groups such as methyl groups, thereby controlling undesirable condensation reactions (and shrinkage effects) during gel drying. FIG. 2C shows a cross-section of a pore after the surface modification step; portions of gel 10 which are on the surface of pore 12 (labeled as region 20) now contain a different species. It has been discovered that by controlling the percentage of reactive surface groups replaced during the surface modification, the final shrinkage may be adjusted from the large shinkage typical of an unmodified xerogel (with uncontrolled shrinkage) to a shrinkage of only a few percent, heretofore only achievable with an aerogel technique. Typically, approximately 30% of the reactive surface groups must be replaced to substantially alleviate densification. Furthermore, the replacement surface species may be chosen because of its wetting properties in combination with specific pore fluids; thus in FIG. 2D, meniscus 18 is significantly flatter than that of FIG. 2B, resulting in a pore fluid contact angle closer to 90 degrees. As the fluid contact angle approaches 90 degrees, the cosine of the contact angle q goes to 0, and the capillary pressure P of Equation 1 is reduced proportionally. It is believed that the surface modification prevents surface condensation reactions, and may also reduce capillary pressure by changing pore fluid contact angle, thereby allowing pores in the surface modified gel to better survive drying. This novel technique can produce a dielectric layer, at atmospheric pressure, with average pore diameter, porosity, and overall shrinkage resembling those of supercritically-dried aerogels.

An additional benefit of the surface modification can be hydrophobicity. It has been found that, for example, replacing only 15% of the reactive surface groups with methyl groups may be sufficient to cause the structure to be hydrophobic. This is an important feature for any material used in semiconductor processing, but particularly so for porous materials. If the porous surfaces are left hydrophilic (water-wanting), the structure is in many ways analagous to a common household sponge, which may hold many times its weight in water. However, the extremely small pore sizes allow a hydrophilic porous dielectric to rapidly gather water out of the surrounding air, the prevention of which would be an added difficulty during device fabrication. By making the pores hydrophobic before the gel is dried, these types of difficulties may be avoided.

Figure 3A:
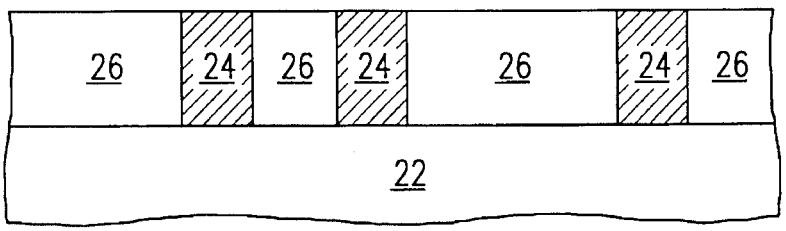
FIGS. 3A–3D show cross-sections of a portion of a semiconductor device, illustrating several steps in the application of an embodiment of the invention to a typical device.
Figure 3B:
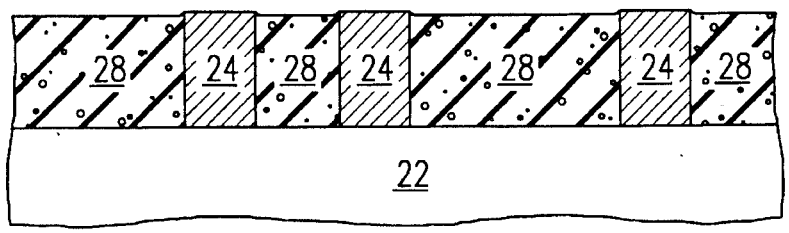

In accordance with the present invention, FIGS. 3A–3D show cross-sections of a semiconductor device at various stages during fabrication. During the description of the embodiments, use of the word wafer will imply a wafer as used in conventional semiconductor processing, with at least the illustrated semiconductor device incorporated therein. In FIG. 3A, three patterned conductors 24 (e.g. of aluminum alloyed with a small amount of copper) are shown formed on an insulating layer 22, which may contain vias or through holes (not shown) for providing electrical contact between conductors 24 and lower layers of the device. A precursor solution 26 is shown disposed between conductors 24, after application to the wafer, for example, by a spin-on technique. The precursor may be prepared, for example, by the following 2-step process. First, TEOS stock, a mixture of tetraethylorthosilicate (TEOS), ethanol, water, and HCl, in the approximate molar ratio 1:3:1:0.0007, is prepared by stirring these ingredients under constant reflux at 60 degrees C. for 1.5 hours. Secondly, 0.05 M ammonium hydroxide is added to the TEOS stock, 0.1 ml for each ml of TEOS stock. Since the addition of the ammonium hydroxide to the stock greatly increases gelation rate, the solution must be quickly applied to the wafer (it may be possible to switch the order of these two steps). After the solution is applied to the wafer, care should be taken to insure that the thin film does not dry prematurely; preferably, the wafer containing the solution/gel remains immersed either in liquid or in a saturated atmosphere at all times prior to the drying stage. Gelation and aging may preferably be accomplished by letting the device sit in a saturated ethanol atmosphere for approximately 24 hours at about 37 degrees C. Next, the water may be removed from the wet gel, preferably by immersing the wafer in pure ethanol. The surface modification step may then be performed, preferably by immersing the wafer in a hexane solution containing about 10% by volume trimethylchlorosilane (TMCS). After a brief reaction time, the unreacted surface modification compound is usually removed by immersing the wafer in an aprotic solvent (e.g. acetone, hexane) and allowing excess solvent to drain. After this solvent exchange, solvent is finally allowed to evaporate from the wet gel 26. This may produce a structure similar to that of FIG. 3B, which illustrates the dried gel now forming a porous dielectric layer 28, and also illustrates the few percent shrinkage typical of this method (the dried porous film thickness is only slightly less than the wet gel thickness). One advantage of this and similar embodiments is that the surface-modified porous dielectric layer is hydrophobic, whereas an otherwise similar supercritically-dried aerogel (without surface modification) tends to be hydrophilic unless subsequently treated.

Figure 3C:
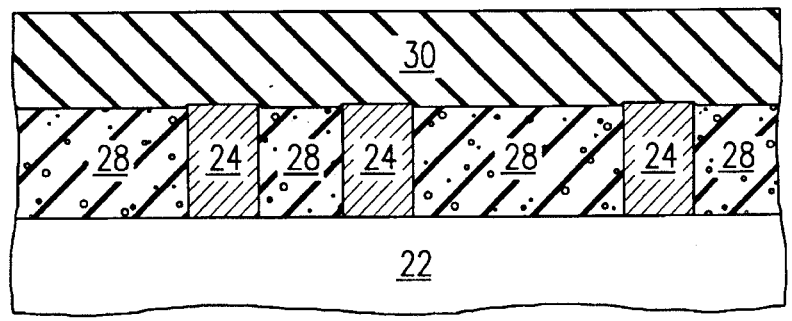
Figure 3D:
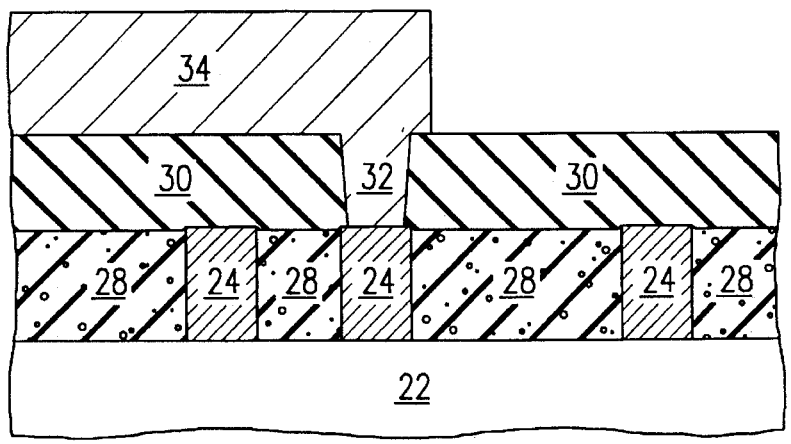

It is preferable to, as shown in FIG. 3C, cap porous layer 28 with a substantially non-porous dielectric layer 30 to seal the open-pored structure, mechanically reinforce the device, and to provide a non-porous layer for via etching and constructing further metal/dielectric layers. This layer may be comprised of silicon dioxide, silicon nitride, a composite layer having silicon dioxide and silicon nitride sublayers, silicon oxynitride, an organic insulator, or similar materials, applied by a method such as chemical vapor deposition (CVD) or as a spin-on glass (SOG). FIG. 3D shows a via etched through non-porous layer 30 and filled with a conducting material to provide a metal-filled via 32, thereby providing a means for electrical connection between a conductor 24 and a second layer of patterned conductors 34, one of which is shown. The non-porous layer in this embodiment forms the majority of the interlayer dielectric. Although the solid dielectric may provide little or no reduction in layer-to-layer capacitance, excellent interlayer mechanical properties are maintained. This is preferred, because it achieves low intralayer capacitance and, at the same time, generally retains mechanical properties of a completely solid intra/interlayer dielectric. This recognizes that intralayer capacitance reduction is much more important than interlayer capacitance reduction.

Figure 4A:
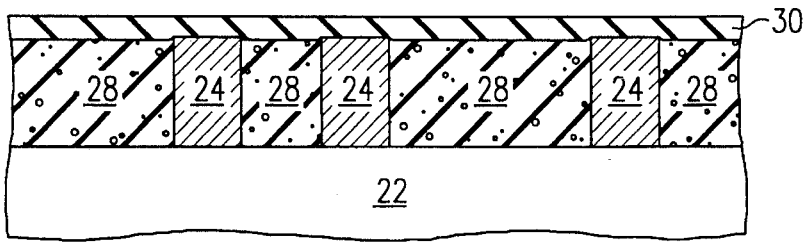
FIGS. 4A–4C show cross-sections of another semiconductor device, illustrating two separate applications of the present invention.
Figure 4B:
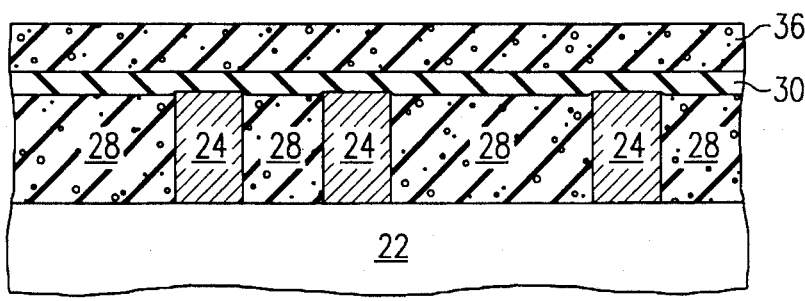
Figure 4C:
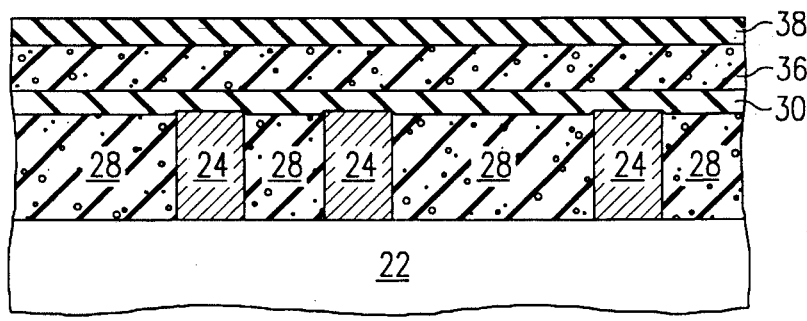

FIGS. 4A–4C show a second embodiment with a different dielectric configuration. FIG. 4A shows a structure similar to that of FIG. 3C, with the one exception being that non-porous dielectric layer 30 is too thin to form the interlayer dielectric. Referring to FIG. 4B, a second porous dielectric layer 36 is created, for example, by coating non-porous dielectric layer 30 with a non-gelled precursor solution and repeating the steps of FIG. 1. A cap layer 38 may be deposited over second porous layer 36, as shown in FIG. 4C. Cap layer 38 may be formed, for instance, using similar materials and processes as those used to create non-porous layer 30. This embodiment can provide a substantially lower interlayer dielectric constant than the previous embodiment, possibly at the expense of some structural strength. However, the non-porous and cap layers can help control via formation, and the cap layer can provide a solid foundation for additional conducting layers.

Figure 5:
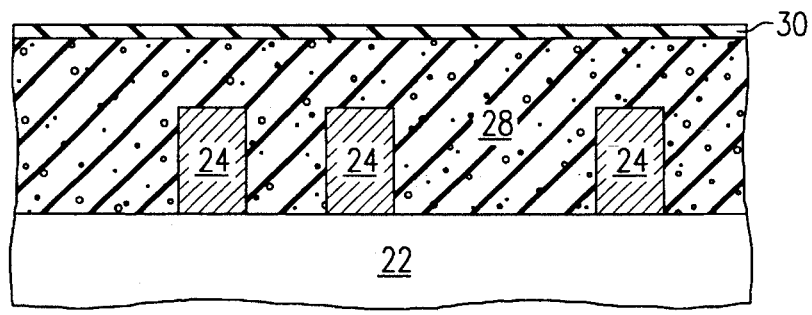
FIG. 5 shows a cross-section of another structure formed with the methods of the current invention, with a relatively thick porous dielectric and a relatively thin non-porous dielectric.

FIG. 5 illustrates an embodiment with only one porous and one non-porous dielectric layer, but with the intralayer and most of the interlayer dielectric generally formed by the porous layer. Porous dielectric layer 28 is preferably formed by increasing the deposited depth of the coating solution to completely cover the conductors to about the depth (measured from substrate 22) required to form the interlayer dielectric. This process may require depositing and gelling solution several times to build the required insulator thickness. Porous dielectric layer 28 may then be dried in accordance with one of the methods of the invention. A non-porous layer 30 may be applied over porous layer 28, for instance, using similar materials and processes as those used to form non-porous layers in the previous embodiments.

Figure 6A:
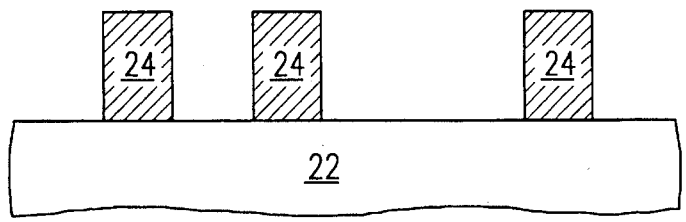
FIG. 6A–6H show cross-sections of yet another semiconductor device with a non-porous dielectric formed by two sublayers.
Figure 6B:
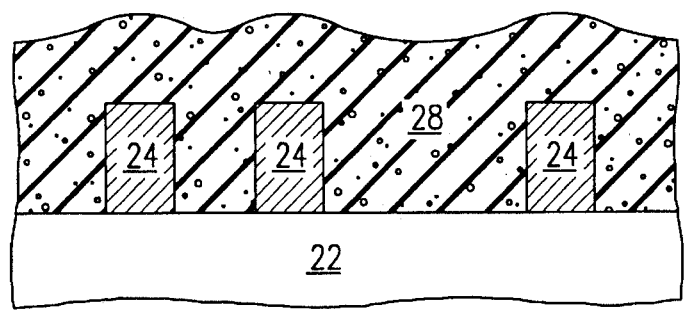
Figure 6C:
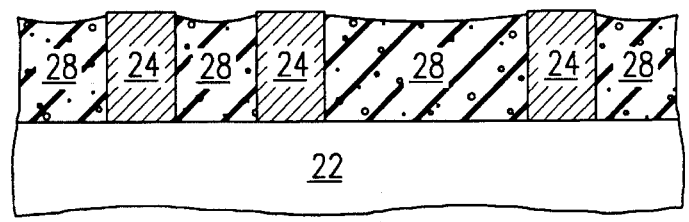
Figure 6D:
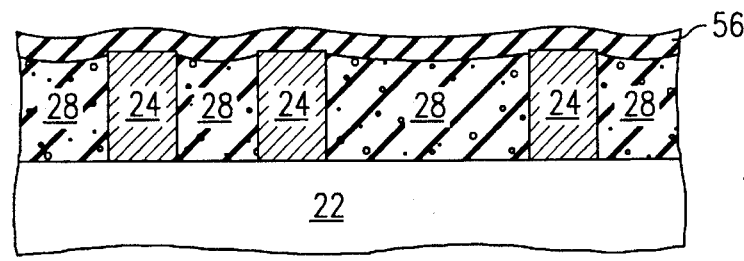
Figure 6E:
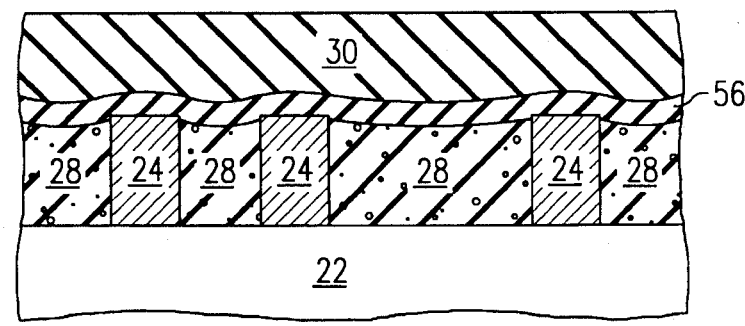

FIGS. 6A–6F show cross-sections of a device construction useful for porous intralayer dielectrics. FIG. 6A again shows patterned conductors 24 on a substrate 22. By a method such as those disclosed above, for example, a porous dielectric layer 28 is constructed to fill gaps between and cover conductors 24, with the dried structure possibly resembling FIG. 6B. FIG. 6C shows the structure after removal of a top portion of porous layer 28 to preferably expose the tops of conductors 24. The material removal may be accomplished, for example, by a controlled chemical etch, such as HF plasma etching, with concentrations and etch times strongly dependent on the dielectric porosity. Alternately, the material removal may be done with a mechanical polisher, using, for example, an aqueous colloidal suspension of silica. This recognizes that it may be easier (and therefore preferable) to deposit a thicker porous layer and etch it back than to more precisely deposit the porous layer only in the gaps between conductors. FIG. 6D shows a step of depositing, preferably by a chemical vapor deposition (CVD) technique, a conformal sublayer 56, of silicon dioxide for example, directly over the porous dielectric layer 28 and the conductors 24. A dry-processed CVD layer, which would primarily deposit near the top of the porous layer, may be preferable to spin-on glass (SOG), which may contain solvents capable of wetting the pores in porous layer 28. However, CVD is not particularly planarizing, and is a relatively slow method for forming a thick dielectric. FIG. 6E illustrates how a non-porous dielectric 30 may be applied over conformal sublayer 56, for example as an SOG oxide, to quickly complete a planarized interlayer dielectric.

Figure 6F:
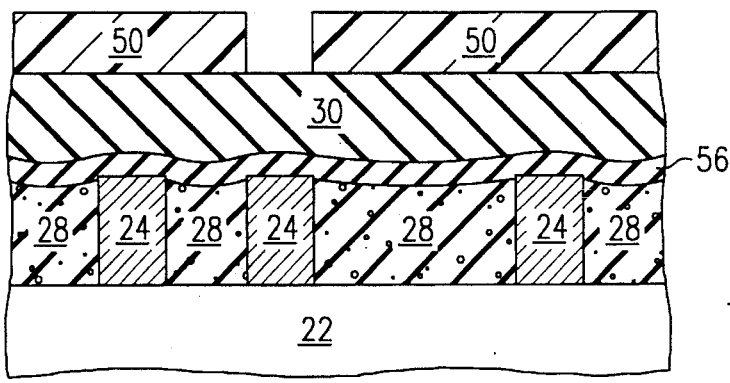
Figure 6G:
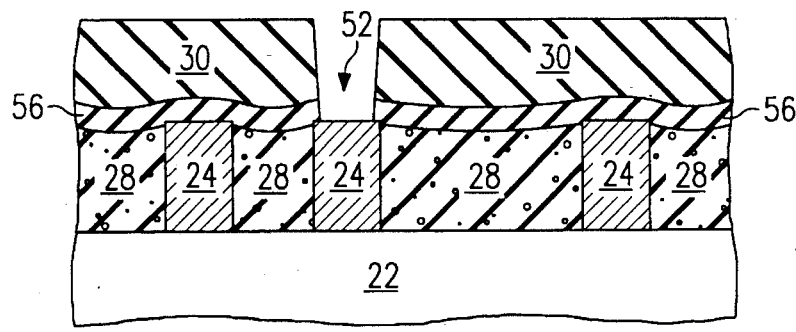
Figure 6H:
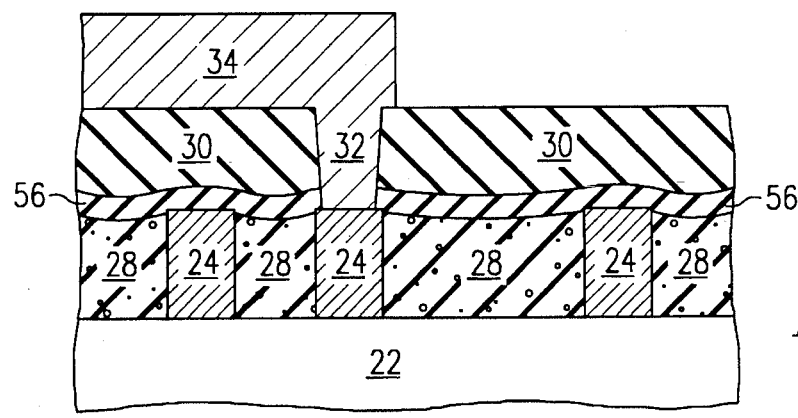

FIG. 6F shows the structure after deposition and patterning of a photoresist mask 50. This prepares the wafer for the etch of via 52 through layers 30 and 56, as shown in FIG. 6G. An advantage of this embodiment is that via 52 does not pass through porous dielectric 28, which may be a difficult material to pattern precisely. Finally, FIG. 6H shows a metal-filled via 32 and one of a second layer of patterned conductors 34, electrically connected by metal-filled via 32 to one of patterned conductors 24. This embodiment of the invention can provide excellent intralayer capacitance reduction, a good mechanical bond between porous and non-porous dielectrics, a straightforward construction technique with largely conventional via formation, and a planarized, non-porous interlayer dielectric with good mechanical and heat transfer characteristics.

Figure 7:
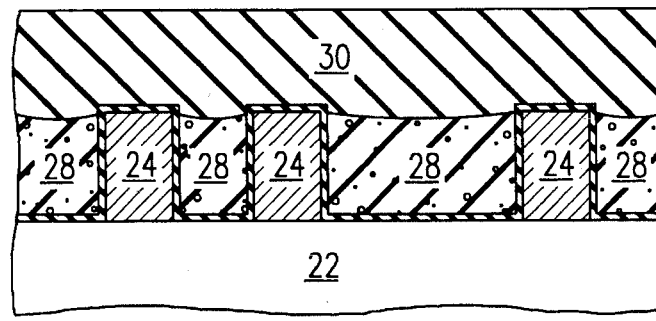
FIG. 7 shows a cross-section of a semiconductor device containing a passivation layer which isolates a porous dielectric layer from direct contact with the conductors.

FIG. 7 is included to illustrate an embodiment wherein porous dielectric layer 28 is isolated from conductors 24 by a relatively thin conformal passivation layer 54, which may be formed, for example, of a CVD silicon dioxide. This layer may be advantageous in several embodiments. In an embodiment such as that of FIG. 6, layer 54 may be removed from the tops of conductors 24 during etchback of porous dielectric 28.

Figure 8A:
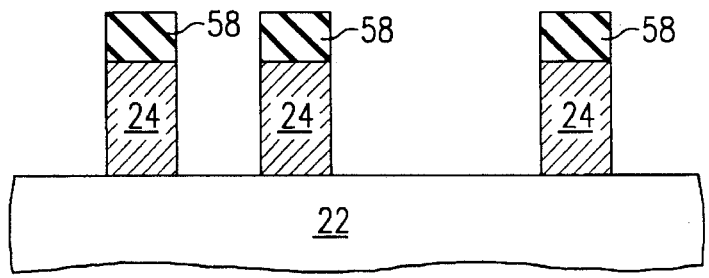
FIGS. 8A–8D show cross-sections of a semiconductor device with dielectric spacers affixed to the tops of conductors.
Figure 8B:
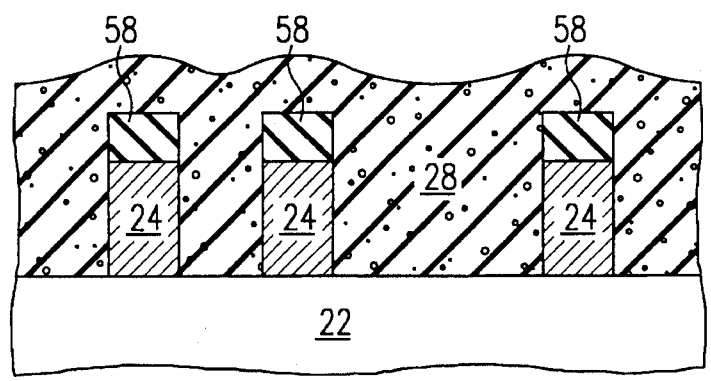
Figure 8C:
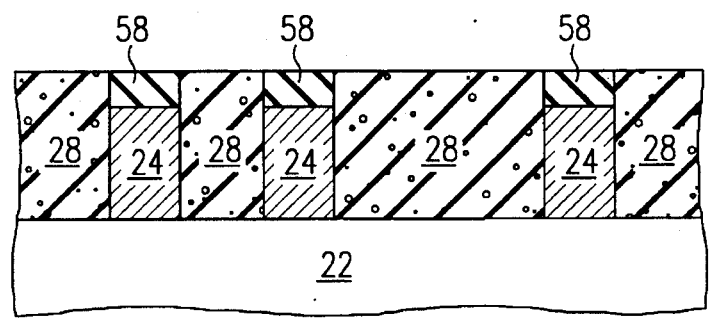
Figure 8D:
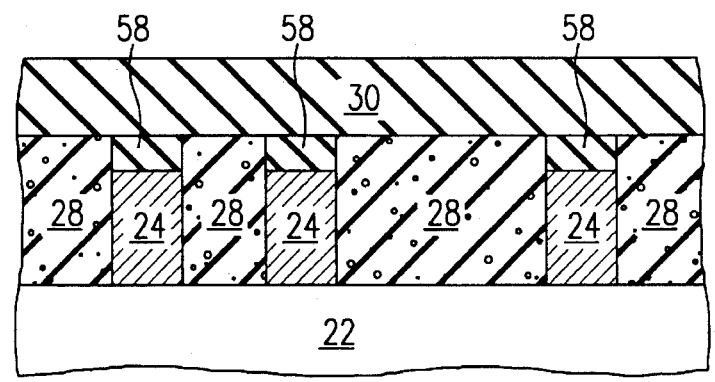

FIGS. 8A–8D illustrate an additional embodiment which includes dielectric spacers. In FIG. 8A, conductors 24 are patterned with dielectric spacers 58 on top of them. The spacers are preferably formed of the same material used in non-porous layer 30 (shown on FIG. 8D). This may be accomplished by depositing a conducting layer, overlaying this with a dielectric layer of a material such as silicon dioxide, and patterning both with one mask. In FIG. 8B, a porous dielectric layer 28 has been formed to preferably cover spacers 58, as shown. FIG. 8C shows the device after a top portion of porous dielectric 28 has been removed. This step preferably exposes the tops of the spacers, and, as FIG. 8C illustrates, in practice a top portion of spacers 58 will probably be removed as well. Finally, FIG. 8D shows the device after non-porous dielectric 30 has been deposited over the structure to complete the interlayer dielectric. An advantage of this embodiment is that the addition of the spacers allows the removal of a top portion of the porous dielectric, without the possibility of removing a portion of the conductors. This structure may also result in lower crosstalk, as compared to the embodiment of FIG. 6.

The following table provides an overview of some embodiments cross-referenced to the drawings.

| Drawing Element | Preferred or Specific Examples | Generic Term | Other Alternate Examples |
| --- | --- | --- | --- |
| 22 | Previous interlayer dielectric | Substrate | Previously-formed layers of a semiconductor device |
| 24,34 | AlCu alloy and/or refractory metal | Conductors | Al, Cu, Mo, W, Ti, and alloys of these Polysilicon, silicides, nitrides, carbides |
| 26 | TEOS stock | Precursor solution | Solution of particulate or colloidal silicon, germanium, titanium, aluminum silicate ratioed TEOS/ MTEOS (methyl-triethoxysilane) stock, ratioed TEOS/ BTMSE (1,2-Bis (trimethoxysilyl) ethane) stock |
| 28,36 | Surface-modified dried gel | Porous dielectric layer | Supercritically-dried aerogel, other fine-pored porous dielectrics |
| 30,38 | Silicon dioxide | Non-porous dielectric layer | Other oxides, B or P-doped SiO$_2$, silicon nitride, silicon oxynitride Parylene, polyimides, organic-containing oxide |
| 32 | AlCu alloy and/or refractory metal | Metal-filled via | Same as conductors above |
| 50 | | Photoresist | |
| 54 | Silicon dioxide | Passivation layer | Silicon nitride, silicon oxynitride |
| 56 | Silicon dioxide | Conformal sublayer | Silicon nitride, silicon oxynitride, organic-containing oxide |
| 58 | Silicon dioxide | Dielectric spacers | Same as non-porous dielectric layer |

The invention is not to be construed as limited to the particular examples described herein, as these are to be regarded as illustrative, rather than restrictive. The invention is intended to cover all processes and structures which do not depart from the spirit and scope of the invention. For example, one skilled in the art could apply one of the many other published methods of initially forming a wet gel from an appropriate precursor to this invention. Alternately, one could substitute organics for a portion of the silica while, for example, still having a material which was principally silica (less than 50 atom percent of the silicon being replaced). Properties of some of the specific examples may be combined without deviating from the nature of the invention.

What is claimed is:

1. A method of forming a porous dielectric on a semiconductor device comprising:

(a) providing a first conductor and a horizontally adjacent second conductor, formed on a substrate wherein a gap is formed between said first and said second conductors;

(b) providing a solution capable of forming a wet gel;

(c) coating said substrate with said solution such that the gap between said first and second conductors is filled substantially with said solution;

(d) gelling said solution to form a wet gel on said substrate, said wet gel containing pores arranged in an open-pored structure; and (e) drying said wet gel to form a substantially undensified porous dielectric layer, said porous dielectric having a dielectric constant less than 3.0 and a pore diameter of less than 80 nm, whereby the capacitive coupling between conductors on the same level is substantially reduced compared to a solid silicon dioxide dielectric.

2. The method of claim 1, further comprising after said gelling step, washing said wet gel with a solvent to substantially remove any water contained in said wet gel.

3. The method of claim 2, further comprising, after said washing step, reacting said wet gel with a surface modification agent to replace at least 15% of reactive groups on the surface of said pores with substantially stable surface groups, whereby unwanted condensation reactions and the densification of said wet gel during said drying step are controlled.

4. The method of claim 3, wherein said reactive groups include hydroxyl groups.

5. The method of claim 3, wherein said stable surface groups are organic.

6. The method of claim 3, wherein said drying step occurs at one or more subcritical pressures.

7. The method of claim 3, wherein after said reacting step, unreacted portions of said surface modification agent are removed from said wet gel.

8. The method of claim 1, wherein said gelling step is accomplished by methods selected from the group consisting of: hydrolyzing and condensing metal alkoxides, gelling of particulate or colloidal metal oxide, and gelling of organic precursors, or a combination thereof.

9. The method of claim 1, wherein said gelling step further comprises aging said wet gel for a period of time at one or more temperatures lower than the boiling point of a solvent contained in said wet gel.

10. The method of claim 1, wherein said pores in said porous dielectric have diameters in the approximate range of 2 nm to 25 nm.

11. The method of claim 1, wherein said porous dielectric is comprised principally of silicon dioxide.

12. A method of forming a porous dielectric on a semiconductor device comprising:

(a) providing a first conductor and a horizontally adjacent second conductor, formed on a substrate wherein a gap is formed between said first and said second conductors;

(b) providing a solution capable of forming a wet gel;

(c) coating said substrate with said solution such that the gap between said first and second conductors is filled substantially with said solution;

(d) gelling said solution to form a wet gel on said substrate, said wet gel containing pores arranged in an open-pored structure:

(e) replacing at least 15% of reactive groups on the surface of said pores with substantially stable surface groups; and (f) drying said wet gel to form a porous dielectric layer, at one or more sub-critical pressures, said porous dielectric having a dielectric constant less than 3.0 and a pore diameter of less than 80 nm, whereby the capacitive coupling between conductors on the same level is substantially reduced compared to a solid silicon dioxide dielectric, and whereby unwanted condensation reactions and densification of said wet gel during said drying step are controlled.

13. The method of claim 12, wherein said replacing step comprises:

(a) washing said wet gel with a solvent to remove substantially any water contained in said wet gel; and (b) reacting said wet gel with a surface modification agent.

14. The method of claim 12, wherein said stable surface groups are organic.

15. The method of claim 12, wherein said drying step is conducted at ambient pressure.

16. The method of claim 12, wherein said pores in said porous dielectric have diameters in the approximate range of 2 nm to 25 nm.

17. A method of forming a porous dielectric on a semiconductor device comprising:

(a) providing a semiconductor substrate;

(b) preparing a solution capable of forming a wet gel;

(c) coating said substrate with a film of said solution, said film having an average thickness between 0.1 microns and 2 microns;

(d) gelling said film to form a wet gel on said substrate, said wet gel containing pores arranged in an open-pored structure;

(e) performing a solvent exchange on said wet gel to remove substantially all water contained in said gel;

(f) reacting said wet gel with a surface modification agent to replace at least 15% of reactive groups on the surface of said pores with substantially stable surface groups; and (g) evaporating said solvent from said wet gel at approximately atmospheric pressure to from a porous dielectric layer, whereby unwanted condensation reactions and the shrinkage of said wet gel during said drying step are controlled.

18. The method of claim 17, wherein after step (f), a second solvent exchange is performed to remove substantially all unreacted surface modification agent from said pores of said gel.

19. The method of claim 17, wherein pores in said porous dielectric have diameters in the approximate range of 2 nm to 25 nm.

20. The method of claim 17, wherein said gelling step further comprises aging said wet gel at one or more elevated temperatures for a time period.

* * * * *